United States Patent [19]
Neilson et al.

[11] Patent Number: 5,877,044
[45] Date of Patent: Mar. 2, 1999

[54] METHOD OF MAKING MOS-GATED SEMICONDUCTOR DEVICES

[75] Inventors: John Manning Savidge Neilson, Norristown; Christopher Boguslaw Kocon, Plains; Richard Douglas Stokes, Shavertown; Linda Susan Brush; John Lawrence Benjamin, both of Mountaintop; Louise Ellen Skurkey, Conyngham; Christopher Lawrence Rexer, Mountaintop, all of Pa.

[73] Assignee: Harris Corporation, Melbourne, Fla.

[21] Appl. No.: 814,842

[22] Filed: Mar. 11, 1997

[51] Int. Cl.$^6$ ................................ H01L 21/332
[52] U.S. Cl. .................. 438/138; 438/268; 438/545
[58] Field of Search ...................... 438/133, 135, 438/138, 268, 545, 546

[56] References Cited

U.S. PATENT DOCUMENTS

| | | | |
|---|---|---|---|
| 5,032,532 | 7/1991 | Mori et al. | 438/138 |
| 5,474,944 | 12/1995 | Zambrano | 438/268 |
| 5,474,946 | 12/1995 | Ajit et al. | 438/138 |
| 5,556,792 | 9/1996 | Zambrano | 438/138 |

*Primary Examiner*—Chandra Chaudhari
*Attorney, Agent, or Firm*—Henry I. Schanzer

[57] ABSTRACT

A gate electrode control structure of an MOS-gated semiconductor device includes four doped regions including a first (source) region forming a first P–N junction with an enclosing composite region comprising a second, lightly doped (channel) region wholly enclosing a third heavily doped (body) region partly enclosing the first region, and a fourth (drain) region forming a P–N junction with the third region. The gate electrode control structure is fabricated using known gate electrode self-alignment doping processes but wherein, in the process for forming the third heavily doped region, a spacer layer is provided on the gate electrode for defining a spacing between the third region and the channel region with an improved degree of precision.

5 Claims, 2 Drawing Sheets

5,877,044

METHOD OF MAKING MOS-GATED SEMICONDUCTOR DEVICES

BACKGROUND OF THE INVENTION

This invention relates to MOS-gated semiconductor devices, and particularly to means for providing improvements in miniaturization of components of the devices and improvements in the electrical performance of the devices.

There now exists a relatively large number of different types of semiconductor devices all making use of metal-oxide-semiconductor (MOS) gate control structures. In general, such devices, e.g., small signal "complementary" MOS devices (CMOS) and power devices such as MOS field-effect transistors (MOSFET), insulated-gate-bipolar transistors (IGBT) and MOS controlled thyristors (MCT), make use of gate control structures comprising a metal electrode overlying a thin dielectric layer (the "oxide") on a surface of a semiconductor substrate including a channel region underlying the gate electrode and extending between source and drain regions of the gate control structure.

In all such devices, it is generally desirable to make the gate control structure as small as possible for maximum high density packing of the devices for high speed circuit operation. Even in power devices where generally large composite structures are required for power handling capacity, better electrical characteristics are obtained by making the gate control structure portions of the device as small as possible and connecting a large number of such gate control structures in parallel in the composite power device.

A presently preferred process for fabricating the various gate control structures includes the use of a masking layer and the photolithographic patterning of the mask for providing precisely dimensioned and positioned windows through the mask through which dopants are introduced into the underlying substrate. Present day limitations on how small and precise the gate control structures can be made are imposed by limitations in the precision with which certain dopants are disposed within the substrate. The present invention is directed at increasing the precision of at least one dopant introduction step whereby smaller and more precisely dimensioned devices can be made.

SUMMARY OF THE INVENTION

An MOS gate control structure is provided by providing, in known manner, a gate electrode structure comprising a layer of an electrically conductive material precisely aligned with and overlying an oxide layer on a surface portion of a semiconductor substrate and then, using the gate electrode structure as a mask in a known "self-alignment" technique, introducing dopants into the substrate to form a first doped (channel) region portion of the gate control structure. Then, in a deviation from the sequence of steps in the prior art process (described hereinafter), dopants are introduced into the substrate again using the gate electrode structure as a mask for forming a second doped (source) region wholly within the first region. Then, for eliminating one photolithographic patterning step used in the prior art process, the gate structure and the substrate surface overlying portions of the previously formed doped regions are coated with a masking material layer having a thickness much less than that of the gate electrode structure. The masking layer coats a vertical wall of the gate electrode structure thereby increasing its lateral extent by at least the thickness of the masking layer. Then, and without patterning the masking layer, dopant ions are projected towards the substrate surface with an energy sufficient to penetrate the thickness of the masking layer where it coats the substrate surface (to provide a third doped, body region) but of insufficient energy to penetrate the vertical direction "thickness" of the masking layer where it coats the vertical wall of the gate electrode structure. In effect, the gate electrode structure is again used as a mask but with increased lateral dimension for providing improved precise positioning of the third doped region relative to the previously provided first and second regions.

DESCRIPTION OF THE DRAWINGS

The drawings are schematic and not to scale.

DESCRIPTION OF PREFERRED EMBODIMENTS

Figure 1:
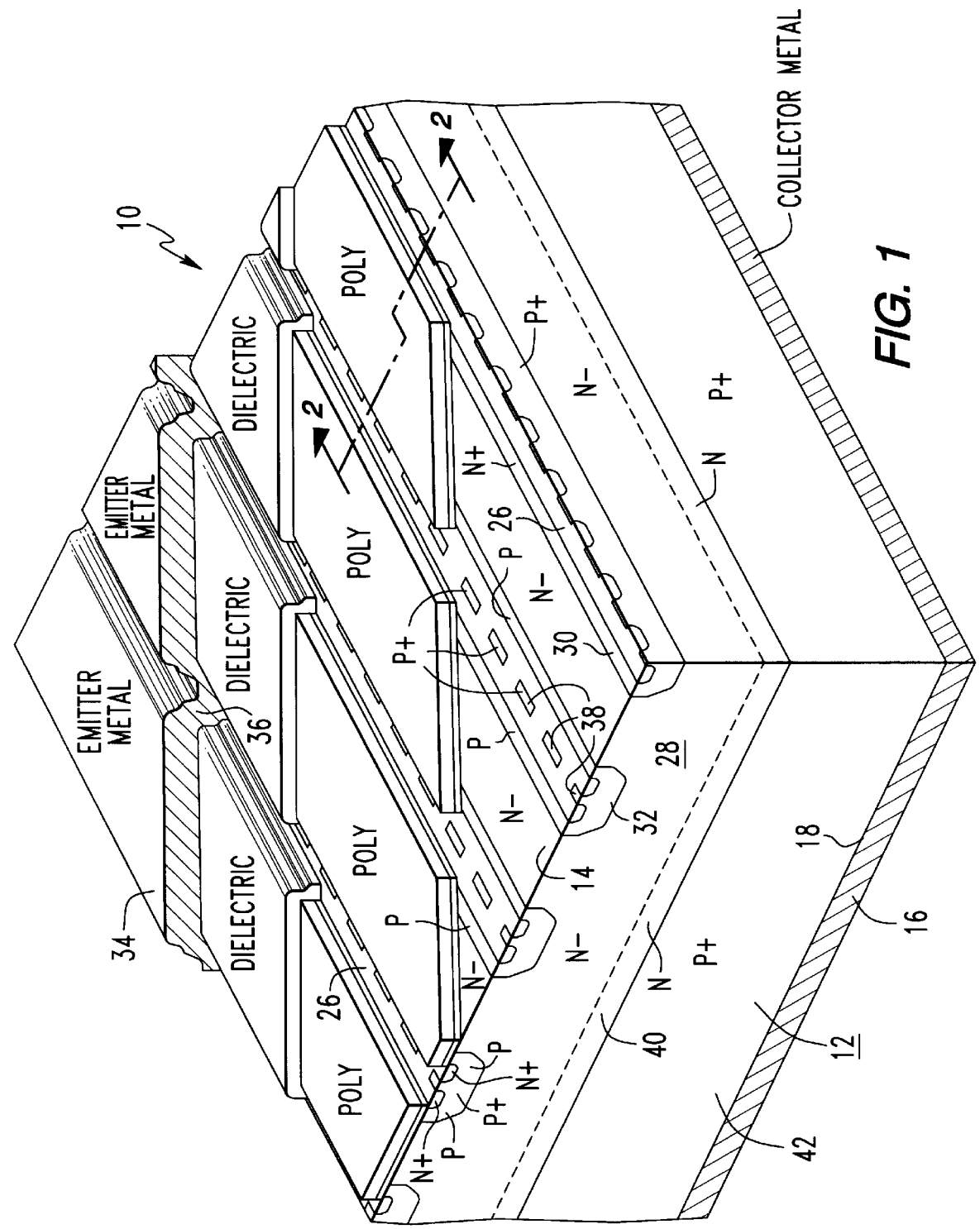
FIG. 1 is a perspective view of a portion of a known IGBT device.
Figure 2:
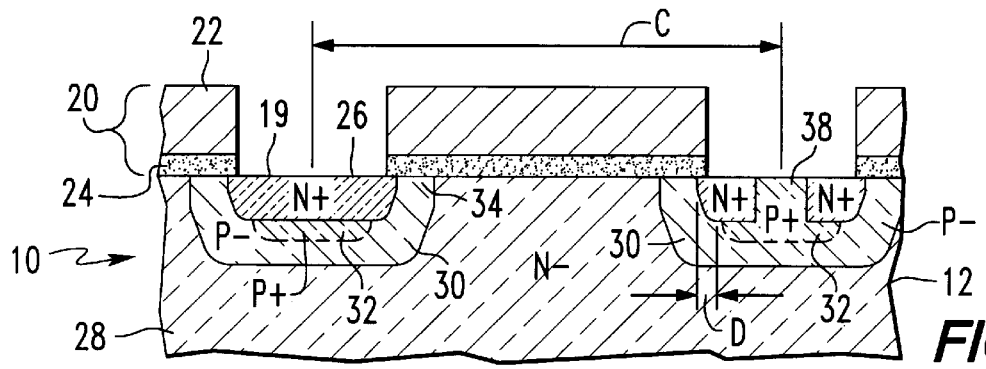
FIG. 2 is a cross-sectional view taken along line 2—2 of FIG. 1.

An example of the "active" portion of a known MOS-gated semiconductor device 10 is shown in FIG. 1. FIG. 1 shows a semiconductor (typically silicon) substrate 12 having various doped regions therewithin and some of the various layers, sequentially cut-away, overlying the upper surface 14 of the substrate 12. Also shown is a metal layer 16 covering the bottom surface 18 of the substrate. FIG. 2 is a cross-section of a portion of the device taken, as indicated in FIG. 1, where only a bottom-most pair of all the layers on the substrate upper surface are present (the overlying layers having been cut-away for greater clarity). The device 10 is an IGBT, and FIG. 2 shows, essentially, a gate control structure which is repeated many times on the surface of the device 10. The gate control structure is typical of gate control structures used in the aforementioned CMOS, MOSFET, and MCT devices.

The device 10 is a single device having but one set of terminals, but comprises a plurality of individual cells connected together in parallel. One such cell C is indicated in cross-section in FIG. 2 with the cell extending the full front to back length of the substrate portion shown in FIG. 1. Each cell comprises a discrete "gate electrode structure 20" (although all the gate structures are connected in parallel by means of an interconnecting metal layer, not shown) comprising a metal layer 22 (typically of doped polycrystalline silicon) precisely aligned with an underlying layer 24 (typically of silicon dioxide) integrally bonded to the surface 14 of the substrate 12.

The gate electrode structure 20 is part of a "gate control structure" including a source region 26 (of N+ conductivity in this example) spaced from an N− drain region 28 by a P type composite region including a P− region 30 and a P+ region 32. The portion of the P− region adjoining the substrate surface 14 comprises a channel region 34 of the MOS control structure, and the P+ region 32 underlying the source region 26 is referred to as a body region.

As mentioned, various layers overlie the substrate 12. One such layer 34 (FIG. 1) of metal, e.g., aluminum, has downward extensions 36 which contact the N+ regions 26 at the surface 14 of the substrate 12 and additionally contact the P+ regions 32 by means of portions 38 extending vertically through the N+ regions 26.

As shown in FIG. 1, the N− region 28 underlies all the cells of the device and overlies a higher conductivity N region 40 overlying, and forming, a P-N junction with a P+ region 42 of the device.

As mentioned, the device 10 is of known structure. As also known, other types of MOS-gated devices can be substantially identical to the device shown in FIGS. 1 and 2 including substantially identical gate control structures, but with different arrangements of doped regions beneath the gate control structures. For example, by replacing the N region 40 and the P+ region 42, shown in FIG. 1, with a single N+ layer disposed between the N− region 28 and the metal layer 16, a MOSFET device is provided.

The present invention is directed to the gate control structures which can be used in all such MOS gated devices.

As mentioned, the channel 34 (FIG. 2) of the MOS structure is provided by an upper portion of the P− region 30 disposed between the N+ source region 26 and the N− drain region 28. Disposed beneath the N+ region 26 and extending almost, but not quite, to the channel region 34 is the P+ region 32. The purpose of the P+ region, as known, is to reduce the gain of a vertical parasitic NPN bipolar transistor formed by the N conductivity type source region 26, the P type composite region 30, 32 and the N type drain region 28. To this end, the P+ region 32 (of high conductivity) is preferably disposed along the full length of the P-N junction formed between the N+ source region 26 and the P− region 30 (an emitter at an N+P+ junction being far less efficient than an emitter at an N+P− junction). Conversely, however, for providing a desired low threshold voltage for controlling the conductivity of the channel region 34, the channel region 34 should be of low (P−) doping concentration. An accepted compromise is to have the P+ region 32 extend to a preselected close distance to the channel region 34 while not extending into it.

As a practical matter, no devices can be made with absolute precision, particularly on a mass produced basis, and the actual design or nominal location of the P+ region 32 relative to the channel region 34 must take into account dimensional tolerances dependent upon the fabrication process used. The more critical requirement concerning the location of the P+ region 32 relative to the channel region 34 is that the P+ region 32 not enter into the channel region 34. Accordingly, the nominal distance D between the P+ region 32 and the channel region 34 is deliberately selected to be slightly greater than the optimum distance. Accordingly, a desired goal is a means for reducing the previously necessary excessive distance D.

A further reason for reducing the distance D is that it is a factor in the total width of each cell C. Assuming that the cell width is already as small as possible as limited, for example, by the minimum widths obtainable for the P+ region 32 and the channel region 34 as determined by the fabrication process used (described hereinafter), the greater the distance D, the greater is the cell width. As previously explained, cells C of the smallest possible width are desired.

FIGS. 3 through 7 show a sequence of processing steps according to a preferred prior art process for fabricating the gate control structure shown in FIG. 2. As previously explained, the FIG. 2 structure, or known variations thereof, is used in many different types of gated semiconductor devices.

Figure 3:
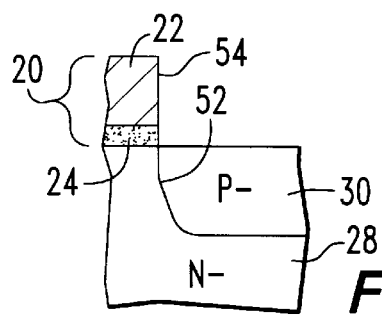
FIGS. 3–7 are a series of cross-sectional views of a portion of a workpiece corresponding to the portion of the device shown in FIG. 2 and showing successive steps in the fabrication of the FIG. 2 device portion.

FIG. 3 shows a workpiece which has been fabricated using known processes. At this point in the fabrication process, the device underlying layers 28, 40 and 42 shown in FIG. 1 have been formed along with the gate electrode structure 20 and the P− region 30. The P− region 30 has been formed by an ion implantation process using the gate electrode structure 20 as a mask whereby the edge surface 52 of the P− region 30 is precisely aligned with a vertical side wall 54 of the gate electrode structure 20.

The P+ region 32 (shown in FIG. 2) is next to be formed using known photolithographic processing techniques. This comprises coating the entire upper surface of the substrate workpiece with a photoresist layer and, by means of a photomask, exposing the photoresist layer through the photomask for defining areas in the photoresist which are then etched away to provide windows, such as the window 56 shown in FIG. 4, through the photoresist layer 58 for exposing an area of the substrate surface. Ions are then implanted through the window 56 for providing the desired P+ region 32. The width of the window 56 is as small as reliably obtainable using known photolithographic properties.

As previously described in connection with FIGS. 1 and 2, the edge surface 52 of the P− region 30 defines the drain end of the channel region 34 (FIG. 2), hence the edge surface 60 of the P+ region 32 must be spaced well away from the edge surface 52 of the P− region 30. This spacing is determined by the distance E between the edge 62 of the window 56 formed through the photoresist layer 58 and the vertical wall 54 of the gate structure 20.

Herein lies the problem addressed by the present invention. While known photolithographic processes are extremely precise, some tolerances must still be provided, and, as previously explained, the distance E between the window edge 62 and the electrode structure edge 54 is necessarily somewhat greater than the preferred optimum distance.

Figure 5:
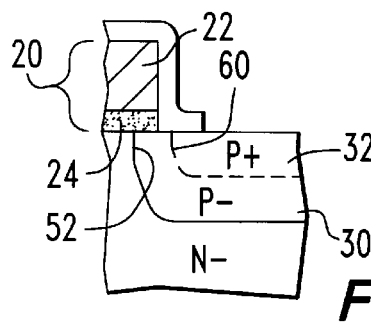

With the P+ region 32 now in place, the workpiece is heated to cause diffusion of both regions 30 and 32 for moving the edge surface 52 of the P− region 30, but not the edge surface 60 of the P+ region 32, beneath the gate structure 20. The result is shown in FIG. 5.

Then (FIG. 6) using the gate structure 20 for defining an ion implantation window 68, N type conductivity ions are implanted into the substrate 12 to form the N+ region 26.

Because the gate electrode structure 20 is used as a mask for locating the edge surfaces of both the N+ region 26 and the P− region 30, the channel region 34 is defined with great precision. Conversely, because the edge 62 of the window 56 (FIG. 4) through a patterned photoresist layer 58 was used to define the surface 60 of the P+ region 32, somewhat less precision is obtainable.

Figure 7:
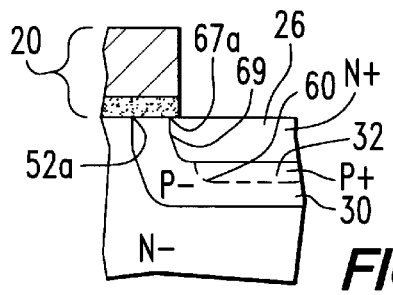

In a next processing step, the workpiece is heated to cause diffusion of the doped regions to the positions shown in FIG. 7. The edge surface 69 of the N+ region 26 is moved beneath the gate structure 20 and intercepts the substrate surface 14 along a line 69a precisely spaced from the substrate surface intercept 52a of the P− region 30.

Thereafter, the device 10 is completed using known processes not requiring description for an understanding of the present invention—which is now described.

Figure 4:
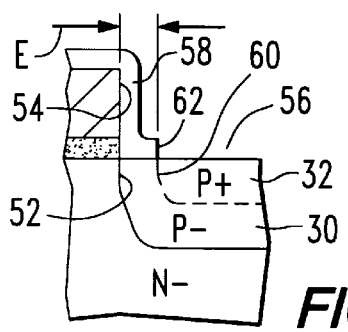

A semiconductor substrate workpiece is first processed according to known processes until the condition shown in FIG. 3. Then, rather than immediately providing a P+ region 32 as shown in FIGS. 4 and 5, followed by providing the N+ region 26 (FIG. 6) in accordance with the prior art, the sequence of steps is reversed and, additionally, use is made of a processing technique not used in the aforedescribed prior art process.

Figure 8:
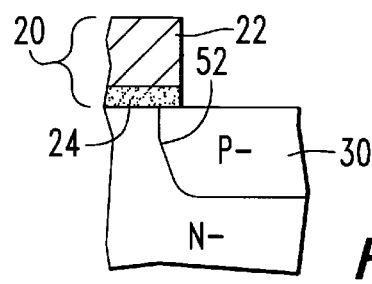
FIGS. 8–10 are views similar to FIGS. 3–7 but showing successive fabrication steps in accordance with the present invention.

First, and starting with a workpiece as shown in FIG. 3, the workpiece is heated to cause (FIG. 8) a precise diffusion of the P– region 30 for increasing its depth a desired amount and for moving the edge surface 52 of the P–region 30, precisely aligned with the gate structure 20 in FIG. 3, to a precisely known position underlying the gate structure 20.

Figure 9:
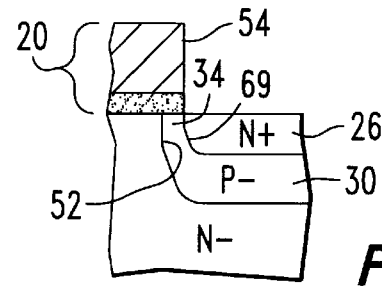
Figure 6:
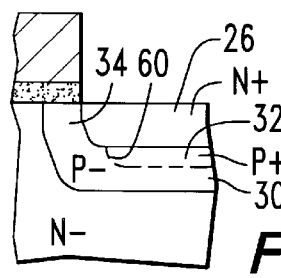

Next (FIG. 9), using the gate structure as a mask, N conductivity type impurities are then implanted to form the N+ regions 26. Because the side wall 54 of the electrode structure 20 has been used as a mask, the edge surface 69 of the N+ region 26 is precisely positioned relative to the edge surface 52 of the P– region 30. The portion of the P– region 30 adjacent to the substrate surface 14 between these region surfaces 69 and 52 is the channel region 34.

Then, in a further deviation from the prior art process previously described, a layer 76 (FIG. 10) of a masking material is deposited on the workpiece. In the present embodiment, using a silicon substrate 12, a polysilicon gate electrode 22 and a silicon dioxide layer 24, the masking layer 76 is preferably of silicon dioxide deposited by a known low temperature deposition process, the resulting layer 76 being referred to as a "low temperature oxide" (LTO). A known suitable LTO deposition process comprises reacting silane gas with oxygen in a reactor for forming and depositing fine particles of silicon dioxide on the workpiece.

As deposited, the LTO layer 76 is in the form of particles and the workpiece is then heated for vitrifying the layer 76. Only a relatively low heating temperature (e.g., around 900 degrees C.) is required which is important for causing little diffusion of the carefully previously positioned regions 26 and 30. This is important because, to the extent that the N+ region surface intercept 69a is disposed excessively inwardly of the vertical wall 54 of the gate structure 20, the length of the channel region 34 is excessively reduced thus changing the device operating characteristics.

It is an important characteristic of the LTO layer 76 that it can be made quite thin, e.g., 500 A–3,000 A, and typically 1,500 A, (in comparison with a thickness of the gate structure 20 of around 9,000 A), with a precise thickness, e.g., with a tolerance of ±5% (i.e., 75 A, or even less, for an LTO layer 76 thickness of 1,500 A), and that it adheres well, with a uniform thickness, to the vertical wall 54 of the electrode structure.

Significantly, the LTO layer 76 is not thereafter patterned. Rather, with the LTO layer 76 in place, P type impurity dopant ions (e.g., boron) are projected towards the substrate surface 14 using a known ion implantation process. The ion implantation energy used is sufficient for the ions to penetrate through the horizontal portions of the LTO layer 76 where they directly overlie the surface 14 of the substrate 12. Conversely, primarily because the ions are projected towards the substrate along directions normal to the substrate surface 14 and parallel to the gate structure vertical wall 54, the ions do not penetrate the vertical length of the LTO layer 76. The quite thin LTO layer 76 is thus effective for increasing the lateral extent of the gate structure 20 with the result that the P+ region 32 thus implanted is spaced away from a projection of the wall 54 into the substrate 12 by a distance equal to the thickness of the LTO layer 76.

The beam energy of the implantation process is sufficient to drive the P type dopant ions through the N+ region 26 and into the underlying P– region 30. Within the P– type region 30, the implanted ions provide the P+ region 32 shown.

Figure 10:
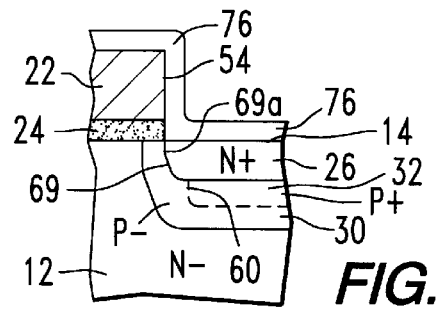

Of significance, the spacing between the edge surface 60 of the P+ region 32 and the edge surface 69 of the N+ region 26 is determined primarily by the thickness of the LTO layer 76 on the electrode structure 20 and, to a quite minor degree, on any small diffusion of the N+ region 26 during the LTO low temperature layer heating step which occurs prior to the P+ implantation step. Comparing the structure resulting from the inventive process as shown in FIG. 10 with the structure resulting from the prior art process shown in FIG. 7, the structures appear substantially identical. A difference, however, is that the accuracy of the positioning of the P+ region 32 relative to the N+ region 26 is a function, in the inventive process, of the LTO deposition process described (not using a photolithographic process) whereas, in the prior art process, it is a function of the described photolithographic patterning process. The positioning tolerances of the LTO process, e.g., ±75 A, or less, are smaller than the photolithographic tolerances, (e.g., ±5,000 A, or higher) whereby the P+ region surface edge 60, using the inventive process, can be positioned more closely to the N+ region surface edge 69 by the difference in the tolerances, e.g., close to 5,000 A.

Accordingly, and as previously discussed in connection with the description of FIG. 2, the closer positioning of the P+ region 32 to the side edge surfaces 69 of the N+ region 26 allows for narrower cells C by, typically, 10%, and corresponding better device performance. Additionally, and as previously discussed, allowing disposition of the P+ region 32 edge surface 60 closer to the N+ region 26 edge surface 69, thus minimizing the length of the junction between the N+ region 26 and the P– region 30, reduces the gain of the parasitic NPN bipolar transistor present adjoining the channel region 34.

Other materials known for use in semiconductor devices can be used for the spacer layer 76. For example, the layer 76 can be of silicon nitride preferably also applied by a known relatively low temperature deposition process. Various glass layers typically used for passivation purposes, e.g., boron-phosphosilicate (BPSG) or phosphosilicate (PSG) glasses can be used. Also, known organic, e.g., photoresist materials can be used, but unlike the other materials mentioned, would have to be eventually removed from the workpiece. Also, the described LTO layer 76 can be applied by other known processes, e.g., the known "liquid spin-on" process.

What is claimed is:

1. A method of fabricating an MOS-gated semiconductor device comprising the steps of forming a gate structure on a surface of a semiconductor substrate and, in a process using a vertical wall of the gate structure as a dopant mask, introducing dopants into the substrate for forming a first doped region of a first type conductivity having a substrate surface first intercept underlying the gate structure, then, in a process again using the vertical wall as a dopant mask, forming a second doped region of a second type conductivity within said first region and having a substrate surface second intercept spaced from said first intercept, then coating said vertical wall of said gate structure and portions of said substrate surface adjoining said gate structure and overlying said first and said second regions with a masking layer thinner than said gate structure, and projecting ions towards said substrate surface with an energy sufficient for penetrating said masking layer where it coats said substrate surface portions but of insufficient energy to penetrate said masking layer where it coats said vertical wall for forming a third doped region of said first type of conductivity wholly within said first doped region and encircling said second doped region except for a portion of said second region forming said substrate surface second intercept.

2. A method of fabricating an MOS-gated semiconductor device comprising the steps of providing, on a first portion of a surface of a semiconductor substrate, a gate electrode structure having a side wall substantially normal to said substrate surface and defining a first surface substantially normal to said substrate surface, forming a first doped region of a first conductivity type underlying a second surface portion of said substrate adjoining said electrode structure, said doped region extending beneath said electrode surface and having an edge surface intersecting said substrate surface along a first line overlaid by said electrode structure and substantially parallel to said first surface defined by said electrode structure, then forming a second doped region of a second conductivity type wholly within said first doped region, said second region having an edge surface intersecting said substrate surface along a second line overlaid by said electrode structure and substantially parallel to and spaced from said first line surface intercept of said first region, then coating said structure side wall and said substrate surface second portion with a first layer of masking material having a thickness less than that of said electrode structure, and then projecting dopant ions towards said substrate surface along directions substantially parallel to said electrode structure side wall at an energy sufficient for causing said ions to penetrate said first layer where it coats said substrate surface for forming a third doped region of said first conductivity type wholly within said first doped region and partially surrounding said second region but of insufficient energy for penetrating, in said parallel direction, either said electrode structure or said first layer where it coats said electrode structure side wall, whereby said third region has an edge surface intersecting the edge surface of said second portion at a position spaced from said second line surface intercept of said second region by a distance at least equal to the thickness of said first masking layer.

3. A method of fabricating an MOS-gated semiconductor device comprising the steps of providing, on a first portion of a surface of a semiconductor substrate, a gate electrode structure having a side wall substantially normal to said substrate surface and defining a first surface substantially normal to said substrate surface, said electrode structure having a first thickness in a direction normal to said substrate surface, coating said structure side wall and a second portion of said substrate surface adjoining said side wall with a first layer of a masking material having a second thickness less than said first thickness, and projecting dopant ions towards said substrate surface along directions substantially parallel to said side wall at an energy sufficient for, along said parallel directions, penetrating said first layer where it coats said substrate surface for implanting ions within said substrate but of insufficient energy for penetrating either said electrode structure or said first layer where it coats said vertical wall, said implanted ions thus forming a first doped region of a first conductivity type within said substrate.

4. A method according to claim 2 including the step of, prior to said coating step, forming a second doped region within a second portion of said substrate adjoining said electrode structure, said second doped region terminating in a second edge surface extending beneath said electrode structure and intersecting said substrate surface along a first line substantially parallel to said first surface defined by said electrode structure side wall and spaced from said first surface.

5. A method according to claim 2 including the step of, prior to said coating step and subsequent to said step for forming said second region, forming a third doped region wholly within said second doped region, said third region terminating in a third edge surface intersecting said substrate surface along a second line lying substantially within said first surface and spaced from said first line surface intercept of said second doped region.

* * * * *